United States Patent
Zhong et al.

(10) Patent No.: US 7,876,862 B2
(45) Date of Patent: Jan. 25, 2011

(54) CONDITIONALLY INPUT SATURATED VITERBI DETECTOR

(75) Inventors: Hao Zhong, Bethlehem, PA (US); German Feyh, Boulder, CO (US)

(73) Assignee: Agere Systems Inc., Allentown, PA (US)

( * ) Notice: Subject to any disclaimer, the term of this patent is extended or adjusted under 35 U.S.C. 154(b) by 732 days.

(21) Appl. No.: 11/778,177

(22) Filed: Jul. 16, 2007

(65) Prior Publication Data

US 2009/0022250 A1 Jan. 22, 2009

(51) Int. Cl.
*H04L 27/06* (2006.01)
*H03D 1/00* (2006.01)
*H03M 13/03* (2006.01)

(52) U.S. Cl. .................. 375/341; 375/340; 375/262; 714/794; 714/795

(58) Field of Classification Search ................. 375/341, 375/262; 714/794, 795
See application file for complete search history.

(56) References Cited

U.S. PATENT DOCUMENTS

| | | | |
|---|---|---|---|
| 5,291,499 A * | 3/1994 | Behrens et al. ............. | 714/796 |
| 5,325,402 A | 6/1994 | Ushirokawa | |
| 5,471,500 A * | 11/1995 | Blaker et al. ................ | 375/340 |
| 5,550,870 A * | 8/1996 | Blaker et al. ................ | 375/341 |
| 5,710,784 A * | 1/1998 | Kindred et al. ............. | 375/262 |
| 5,844,945 A | 12/1998 | Nam et al. | |
| 5,923,713 A | 7/1999 | Hatakeyama | |
| 6,216,249 B1 * | 4/2001 | Bliss et al. .................. | 714/792 |
| 6,229,467 B1 * | 5/2001 | Eklund et al. ............... | 341/120 |
| 6,317,472 B1 | 11/2001 | Choi et al. | |
| 6,748,034 B2 | 6/2004 | Hattori et al. | |
| 7,073,118 B2 * | 7/2006 | Greenberg et al. .......... | 714/796 |
| 7,111,226 B1 * | 9/2006 | Cameron et al. ............ | 714/794 |
| 7,236,757 B2 * | 6/2007 | Raghavan et al. ........... | 455/203 |
| 7,313,750 B1 * | 12/2007 | Feng et al. ................... | 714/796 |
| 7,403,752 B2 * | 7/2008 | Raghavan et al. ........... | 714/756 |
| 7,590,168 B2 * | 9/2009 | Raghavan et al. ........... | 375/219 |
| 2003/0081693 A1 * | 5/2003 | Raghavan et al. ........... | 375/298 |

(Continued)

OTHER PUBLICATIONS

Mohsenin et al., "Split Row: A Reduced Complexity, High Throughtput LDPC Decoder Architecture", pp. 1-6, printed from www.ece.ucdavis.edu on Jul. 9, 2007.

(Continued)

*Primary Examiner*—David C Payne
*Assistant Examiner*—Erin M File
(74) *Attorney, Agent, or Firm*—Hamilton, DeSanctis & Cha

(57) ABSTRACT

Various embodiments of the present invention provide systems and methods for decoding encoded information. For example, a decoder including a branch metric calculator that conditionally calculates a branch metric based on either an actual input or a saturated input. Such a branch metric calculator is operable to receive an actual input, and to compare the actual input with an expected range. At times, the aforementioned comparison yields a comparison result indicating that the actual input is outside of the expected range. A first branch metric associated with a first branch is calculated. Where the first branch has an expected value representing a boundary of the expected range, calculating the first branch metric is done using the saturated input. Further, a second branch metric associated with a second branch is calculated. Where the second branch has an expected value representing something other than a boundary of the expected range, calculating the second branch metric is done using the actual input.

20 Claims, 3 Drawing Sheets

U.S. PATENT DOCUMENTS

| | | | |
|---|---|---|---|
| 2003/0087634 A1* | 5/2003 | Raghavan et al. | 455/423 |
| 2003/0112896 A1* | 6/2003 | Raghavan et al. | 375/322 |
| 2003/0134607 A1* | 7/2003 | Raghavan et al. | 455/132 |
| 2003/0135812 A1* | 7/2003 | Akiyama et al. | 714/794 |
| 2005/0010855 A1* | 1/2005 | Lusky | 714/796 |
| 2005/0050432 A1* | 3/2005 | Chen et al. | 714/776 |
| 2005/0195749 A1* | 9/2005 | Elmasry et al. | 370/252 |
| 2005/0213690 A1* | 9/2005 | Lauer et al. | 375/341 |
| 2010/0002795 A1* | 1/2010 | Raghavan et al. | 375/265 |

OTHER PUBLICATIONS

Zhong et al., "Area-Efficient Min-Sum Decoder VLSI Architecture for High-Rate QC-LDPC Codes in Magnetic Recording", pp. 1-15, Submitted 2006, not yet published.

Zhong, "Block-LDPC: A Practical LDPC Coding System Design Approach", IEEE Trans. on Circuits, Regular Papers, vol. 5, No. 4, pp. 766-775, Apr. 2005.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHCON, pp. 1-4, Oct. 2005.

Zhong et al., "Joint Code-Encoder-Decoder Design for LDPC Coding System VLSI Implementation", ISCAS, IEEE pp. 389-392, May 2004.

Zhong et. al., "Quasi Cyclic LDPC Codes for the Magnetic Recording Channel: Code Design and VLSI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

* cited by examiner

CONDITIONALLY INPUT SATURATED VITERBI DETECTOR

BACKGROUND OF THE INVENTION

The present invention is related to systems and methods for decoding information, and more particularly to systems and methods for Viterbi detection.

A number of systems rely on Viterbi decoding to process information. For example, various transmission and data storage systems rely on Viterbi decoding to recover transmitted and stored information. In a typical scenario, a data set is encoded, and the encoded data set is then distributed in such a way that one or more errors are possibly introduced to the data set because of noise. The potentially corrupted data set is provided to a Viterbi decoder that operates to determine a most likely match for the potentially corrupted data set. Determination of the most likely match is done by selecting a path exhibiting the closest distance between the received input and a possible code. Using this process, one or more errors included in the received data set may be corrected. In another typical scenario, a data set is transmitted through a channel which introduces inter-symbol-interference (ISI) as well as other noise, and the Viterbi detector (i.e., decoder or equalizer) is used to cancel the ISI and recover the data set.

In some cases, an input received by the Viterbi detector is out of bounds indicating the occurrence of some level of signal corruption. In many existing Viterbi detectors, such aberrant inputs are simply processed using a process similar to other inputs. Such an approach provides an effective error correction scheme, however, the out of bounds inputs reduce the accuracy of the Viterbi detector output. Other approaches operate to saturate all out of bounds inputs in an effort to limit the effect of such inputs on the Viterbi processing. This process of globally saturating the input where an out of bounds condition is found may significantly degrade the performance of the Viterbi detector.

Hence, for at least the aforementioned reasons, there exists a need in the art for advanced systems and methods for decoding information.

BRIEF SUMMARY OF THE INVENTION

The present invention is related to systems and methods for decoding information, and more particularly to systems and methods for Viterbi detection.

Various embodiments of the present invention provide detectors/decoders that include a branch metric calculator operable to receive an actual input, and to compare the actual input with an expected range. At times, the aforementioned comparison yields a comparison result indicating that the actual input is outside of the expected range. A first branch metric associated with a first branch is calculated. Where the first branch has an expected value representing a boundary of the expected range, calculating the first branch metric is done using the saturated input. Further, a second branch metric associated with a second branch is calculated. Where the second branch has an expected value representing something other than a boundary of the expected range, calculating the second branch metric is done using the actual input. In various instances of the aforementioned embodiments where the first branch metric is calculated using the saturated input and the second branch metric is calculated using the actual input, the value of the second branch metric is greater than the value of the first branch metric.

In some instances of the aforementioned embodiments, the detector further comprises a path metric calculator. The path metric calculator is operable to calculate a first path metric and a second path metric. The first path metric is calculated using the first branch metric, and the second path metric is calculated using the second branch metric. The path metric calculator is further operable to determine which of the first path metric and the second path metric is associated with a most likely codeword.

In one or more instances of the aforementioned embodiments, calculating the first branch metric using the saturated input is conditioned upon determining that the comparison result indicates that the actual input is greater than the expected range, and the first branch has an expected value representing an upper boundary of the expected range. In such cases, the saturated input has a value representing the upper boundary of the expected range. In particular instances, the value representing the upper value of the expected range is equal to the upper value of the expected range.

In other instances of the aforementioned embodiments, calculating the first branch metric using the saturated input is conditioned upon determining that the comparison result indicates that the actual input is less than the expected range, and the first branch has an expected value representing a lower boundary of the expected range. In such cases, the saturated input has a value representing the lower boundary of the expected range. In particular instances, the value representing the lower value of the expected range is equal to the lower value of the expected range.

Other embodiments of the present invention provide methods for data decoding using conditional input saturation. Such methods include providing a branch metric calculator, which is operable to calculate a branch metric associated with a branch with an expected branch input. The methods further include receiving an actual input at the branch metric calculator, and comparing the actual input with an expected range to yield a comparison result. Further, a saturated input is created. A branch metric is calculated using either the actual input or the saturated input. Use of the saturated input in place of the actual input is conditioned upon a combination of the expected branch input and the comparison result.

In some instances of the aforementioned embodiment, the comparison result indicates that the actual input is greater than the expected range and the branch has an expected value representing the upper boundary of the expected range. In such cases, the saturated input is used to calculate the branch metric, and the saturated input represents the upper boundary of the expected range. In particular instances of the aforementioned embodiments, the value representing the upper value of the expected range is equal to the upper value of the expected range. Calculating the branch metric may include calculating a Euclidean distance between the saturated input value and the expected value. In such cases where the saturated input is equal to the upper boundary of the expected range, the branch metric is approximately equal to zero.

In some instances of the aforementioned embodiments, the methods further include calculating another branch metric associated with another branch with another expected branch input. The latter branch metric is calculated using the actual input. In such cases, the latter expected branch input may be different from a value of the boundary of the expected range. Calculating the second branch metric includes calculating a Euclidean distance between the actual value of the input and the latter expected branch input, and the latter branch metric is greater than the former branch metric.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for decoding information, and more particularly to systems and methods for Viterbi detection.

Figure 1:
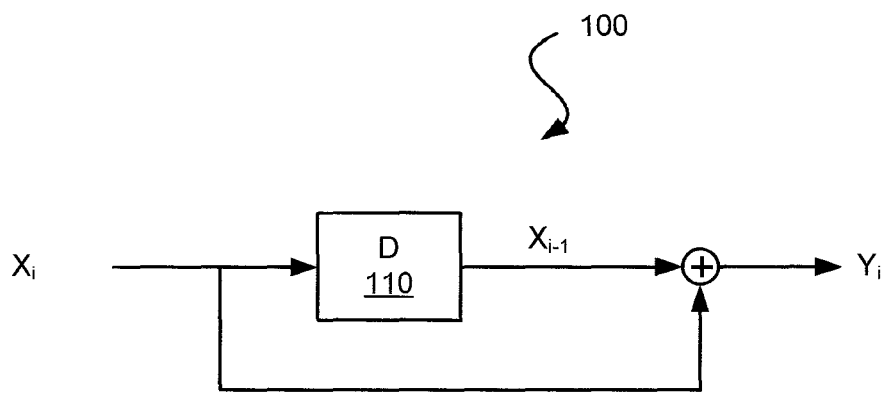
FIG. 1 is a transmission channel model representing a simplified transmission channel and used to support discussion of the inventions discussed herein.

At the outset, it should be noted that the term decoder is used in its broadest sense to mean any system, device or circuit that is capable of receiving a signal and recovering information from the signal. Thus, as used herein, the terms "decoder", "detector" and "equalizer" are used interchangeably. Turning to FIG. 1, a transmission channel model 100 describes a simplified transmission channel that provides a background for describing the various inventions covered herein. Transmission channel model 100 includes a transmitted signal (Xi) that is provided across a channel 110 resulting in an output Xi-1 that is aggregated with Xi to yield the output of the channel 110, Yi. Operation of this simplified channel is described by the following equation:

$$Y_i = X_i - X_{i-1}.$$

As an example, Xi may be modulated such that a value of '10' results anytime Xi is a logic '1', and a value of '−10' results anytime Xi is a logic '0'. Thus, the value of Yi is expected to vary between one of three distinct input levels: 20, 0, −20. As a particular example, the input 0, 1, 1, 0 (i.e., $X_0, X_1, X_2, X_3$) results in the output 20, 0, −20 (i.e., $Y_1, Y_2, Y_3$). It should be noted that the aforementioned values are merely exemplary, and that one of ordinary skill in the art will recognize a variety of values that may be applied to the exemplary transmission channel. Further, it should be noted that the transmission channel is also merely exemplary and that one of ordinary skill in the art will recognize more complex transmission channels, storage channels, and/or other situations to which embodiments of the present invention may be applied.

Figure 2:
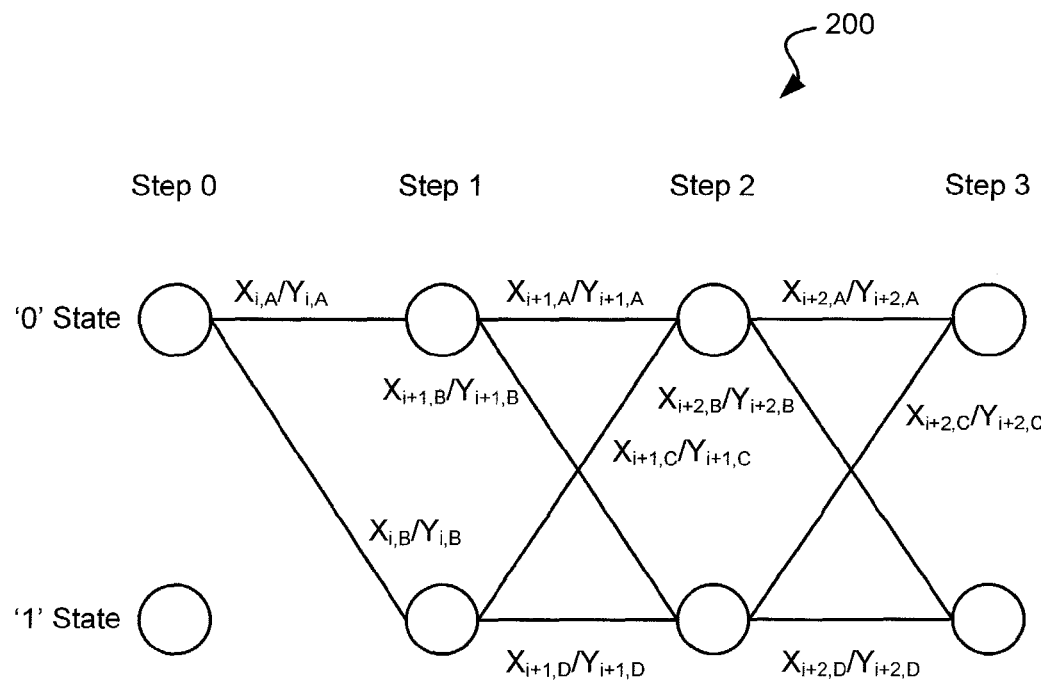
FIG. 2 is an exemplary trellis diagram depicting an exemplary set of state transitions and associated branch metrics used for discussion purposes in the document.

Turning to FIG. 2, a trellis diagram 200 shows the application of a Viterbi algorithm to the output Yi of transmission channel model 100 to recover the input (i.e., Xi) thereof. Application of a Viterbi algorithm operates to determine which decoded output is closest to the original input based on the above mentioned polynomial. In particular, trellis diagram 200 shows two states (i.e., '0' State and '1' State) respectively represented as circles corresponding to each step (i.e., Step 0, Step 1, Step 2 and Step 3) of the decoding process. As shown, each state represented by a circle includes two transitive states leading thereto that are respectively selected depending upon the input Yi. In particular, a transition from the '0' State to the '0' State between Step 0 and Step 1 is represented as $X_{i,A}/Y_{i,A}$; a transition from the '0' State to the '1' State between Step 0 and Step 1 is represented as $X_{i,B}/Y_{i,B}$; a transition from the '0' State to the '0' State between Step 1 and Step 2 is represented as $X_{i+1,A}/Y_{i+1,A}$; a transition from the '0' State to the '1' State between Step 1 and Step 2 is represented as $X_{i+1,B}/Y_{i+1,B}$; a transition from the '1' State to the '0' State between Step 1 and Step 2 is represented as $X_{i+1,C}/Y_{i+1,C}$; a transition from the '1' State to the '1' State between Step 1 and Step 2 is represented as $X_{i+1,D}/Y_{i+1,D}$; a transition from the '0' State to the '0' State between Step 2 and Step 3 is represented as $X_{i+2,A}/Y_{i+2,A}$; a transition from the '0' State to the '1' State between Step 2 and Step 3 is represented as $X_{i+2,B}/Y_{i+2,B}$; a transition from the '1' State to the '0' State between Step 2 and Step 3 is represented as $X_{i+2,C}/Y_{i+2,C}$; and a transition from the '1' State to the '1' State between Step 2 and Step 3 is represented as $X_{i+2,D}/Y_{i+2,D}$. Using the previous example where Yi is ideally [20, 0, −20] where Xi is [10, −10] the following equations describe the values associated the transitions of trellis diagram 200 for the respective values Xi and Yi:

$Y_{i,A}=0$ and $X_{i,A}=-10$;

$Y_{i,B}=20$ and $X_{i,B}=10$;

$Y_{i+1,A}=0$ and $X_{i+1,A}=-10$;

$Y_{i+1,B}=20$ and $X_{i+1,B}=10$;

$Y_{i+1,C}=-20$ and $X_{i+1,C}=-10$;

$Y_{i+1,D}=0$ and $X_{i+1,D}=10$;

$Y_{i+2,A}=0$ and $X_{i+2,A}=-10$;

$Y_{i+2,B}=20$ and $X_{i+2,B}=10$;

$Y_{i+2,C}=-20$ and $X_{i+2,C}=-10$; and $Y_{i+2,D}=0$ and $X_{i+2,D}=10$.

Thus, following trellis diagram 200 and assuming the current state is the '0' State, the transition from Step 0 to Step 1 includes calculating the Euclidean distance between the actual input $R_i$ and $Y_{i,A}$ and the Euclidean distance between the input $R_i$ and $Y_{i,B}$. In particular, the following equation defines the branch metric associated with transitioning from the '0' State to the '0' State from Step '0' to Step '1':

$$BM(0-0)_1 = (R_i - Y_{i,A})^2.$$

The following equation defines the branch metric associated with transitioning from the '0' State to the '1' State from Step '0' to Step '1':

$$BM(0-1)_1 = (R_i - Y_{i,B})^2.$$

Similarly, for the transition between Step 1 and Step 2, the following equations represent the four possible branch metrics:

$$BM(0-0)_2=(R_i-Y_{i+i,A})^2;$$

$$BM(0-1)_2=(R_i-Y_{i+i,B})^2;$$

$$BM(1-0)_2=(R_i-Y_{i+1,C})^2; \text{ and}$$

$$BM(1-1)_2=(R_i-Y_{i+1,D})^2.$$

For the transition between Step 2 and Step 3, the following equations represent the four possible branch metrics:

$$BM(0-0)_3=(R_i-Y_{i+2,A})^2;$$

$$BM(0-1)_3=(R_i-Y_{i+2,B})^2;$$

$$BM(1-0)_3=(R_i-Y_{i+2,C})^2; \text{ and}$$

$$BM(1-1)_3=(R_i-Y_{i+2,D})^2.$$

In operation, upon receiving a series of inputs Ri, branch metrics associated with the respective Step transitions are calculated. These branch metrics are then combined into a number of path metrics. For 'n' steps, the number of path metrics is $2^{n-1}$. Thus, for trellis diagram 200, eight path metrics are calculated. Path metrics may be calculated by adding the branch metrics associated with the given path. The following equations represent the seven path metrics corresponding to trellis diagram 200:

$$PM(1)=BM(0-0)_1+BM(0-0)_2+BM(0-0)_3;$$

$$PM(2)=BM(0-0)_1+BM(0-0)_2+BM(0-1)_3;$$

$$PM(3)=BM(0-0)_1+BM(0-1)_2+BM(1-1)_3;$$

$$PM(4)=BM(0-0)_1+BM(0-1)_2+BM(1-0)_3;$$

$$PM(5)=BM(0-1)_1+BM(1-1)_2+BM(1-1)_3;$$

$$PM(6)=BM(0-1)_1+BM(1-1)_2+BM(1-0)_3;$$

$$PM(7)=BM(0-1)_1+BM(1-0)_2+BM(0-0)_3; \text{ and}$$

$$PM(7)=BM(0-1)_1+BM(1-0)_2+BM(0-1)_3.$$

Of these calculated path metrics, the smallest is selected as it represents the most likely match between the received input and a possible code. Again, based on the disclosure provided herein one of ordinary skill in the art will recognize that trellis diagram 200 is merely exemplary, and that a variety of coding approaches and associated trellis diagrams may be utilized for encoding and decoding in relation to different embodiments of the present invention. For example, the two state example may be replaced with a trellis diagram exhibiting more than two states, and/or more or fewer than three steps. Such trellis diagrams may be selected to represent more complicated polynomials may be utilized in relation to one or more embodiments of the present invention.

Figure 3:
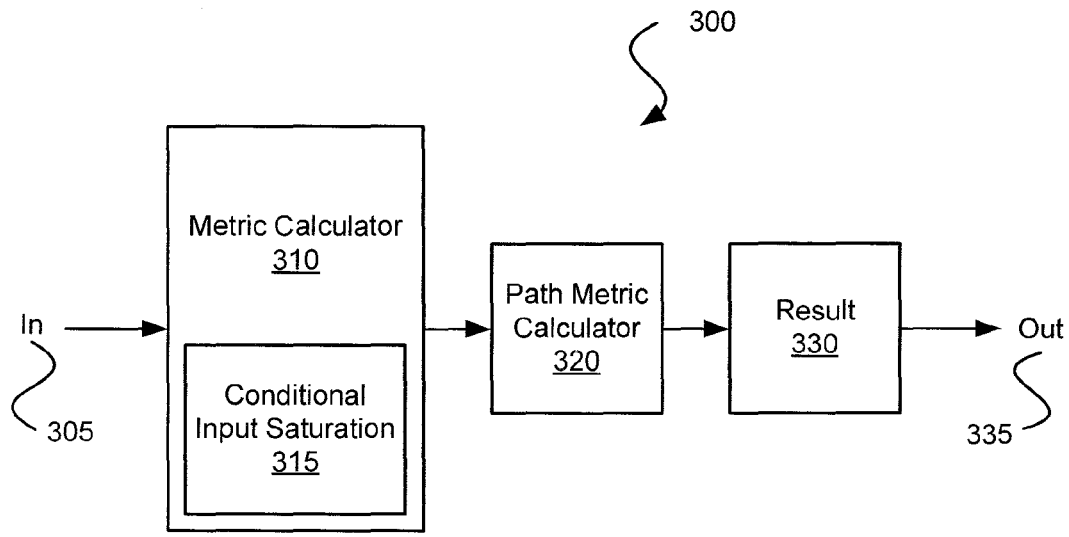
FIG. 3 shows a decoding system including a conditional input saturation module in accordance with various embodiments of the present invention.

Turning now to FIG. 3, a soft-input Viterbi decoder 300 is depicted including a branch metric calculator 310, a path metric calculator 320, and a result system 330. Viterbi decoder 300 is operable to receive an input 305 and to provide an output 335. Branch metric calculator 310 includes a conditional input saturation control 315. Branch metric calculator 310 is operable to receive input 305 and to calculate branch metrics which in some cases are influenced by conditionally saturating input 305 as more fully discussed below. In some embodiments of the present invention, branch metrics are calculated as Euclidean distances similar to that discussed above in relation to FIG. 2 after the previously mentioned conditional saturation that may be applied to input 305. Such branch metrics may be, as discussed above, Euclidean distances between input 305 and every possible symbol in the code alphabet.

Path metric calculator 320 receives a set of branch metrics from branch metric calculator 310 and calculates path metrics associated with the various possible paths, and result system 330 selects the path exhibiting the smallest path metric as the most likely code matching input 305. Based on the selected path, result system 330 provides output 335 as is known in the art. It should be noted that path metrics may be calculated using one or more algorithms, and that any suitable algorithm may be used in relation to the embodiments of the present invention. In one particular embodiment of the present invention, path metrics are calculated similar to that discussed above in relation to FIG. 2, but modified to reflect the paths available in a particular implementation.

In operation, an input is received via input 305. The input is compared against a defined boundary condition, and based on the comparison the respective branch metrics are calculated in accordance with the following pseudo-code:

```
For Each Possible Branch
{
    If ((Input 305 > UpperBoundary && IdealValue = UpperBoundary) ||
       (Input 305 < LowerBoundary && IdealValue = LowerBoundary))
    {
        BranchMetric = 0
    }
    Else
    {
        BranchMetric = (Input 305 – IdealValue)²
    }
}
```

Using the exemplary values discussed above in relation to trellis diagram 200 of FIG. 2, UpperBoundary is twenty (20) and LowerBoundary is negative twenty (–20). In such a case, anytime input 305 is between negative twenty and positive twenty, the branch metric associated with the particular path is simply the Euclidean distance. Similarly, anytime input 305 is outside the range of negative twenty to positive twenty and the Yi is something other than the UpperBoundary or the LowerBoundary, the branch metric associated with the particular path is the Euclidean distance. In contrast, anytime input 305 is greater than the range of negative twenty to positive twenty and the IdealValue (i.e., the ideal branch metric) is equal to the UpperBoundary, the branch metric is set equal to zero. This results from saturating input 305 to the UpperBoundary (i.e., rendering input 305 equal to the IdealValue resulting in a Euclidean distance equal to zero). Similarly, anytime input 305 is less than the range of negative twenty to positive twenty and the IdealValue (i.e., the ideal branch metric) is equal to the LowerBoundary, the branch metric is also set equal to zero. This results from saturating input 305 to the LowerBoundary (i.e., rendering input 305 equal to the IdealValue resulting in a Euclidean distance equal to zero).

Such an approach of conditionally saturating input 305 results in a more accurate operation of the Viterbi decoder. Indeed, unconditionally saturating input 305 whenever it is out of range may reduce the accuracy of the Viterbi decoder as a competing path may be advantaged over a surviving path, thereby leading to a reduced accuracy of the Viterbi decoder.

Hence, saturating input 305 any time it exceeds an expected range may reduce accuracy compared with a non-saturating operation, but conditionally saturating input 305 increases accuracy compared with the non-saturating operation.

Figure 4:
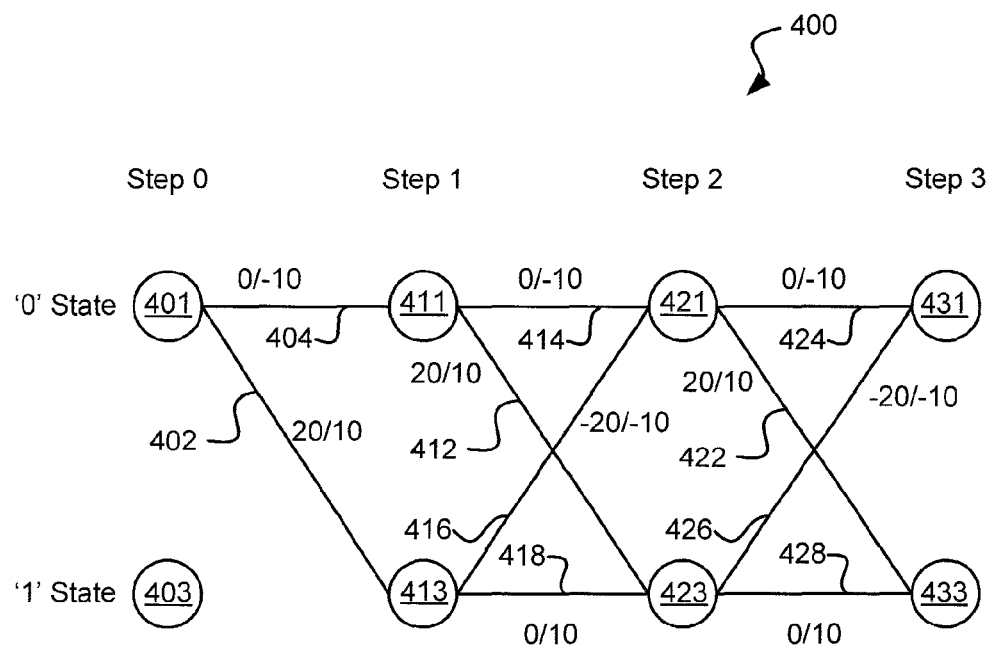
FIG. 4 is the trellis diagram of FIG. 2 augmented to support discussion of the inventions discussed herein.

Turning to FIG. 4, a trellis diagram 400 is depicted that is the trellis diagram of FIG. 2 modified to include designation of each branch of the trellis. In particular, between Step '0' and Step '1', a branch 402 extends between a state 401 and a state 413, and a branch 404 extends between state 401 and a state 411. Between Step '1' and Step '2', a branch 412 extends between state 411 and a state 423, a branch 414 extends between state 411 and a state 421, a branch 416 extends between state 413 and state 421, and a branch 418 extends between state 413 and state 423. Between Step '2' and Step '3', a branch 422 extends between state 421 and a state 433, a branch 424 extends between state 421 and a state 431, a branch 426 extends between state 423 and state 431, and a branch 428 extends between state 423 and state 433. The Xi and Yi values corresponding to each branch of trellis diagram 400 are set forth below using the exemplary expected input ranging between negative twenty and positive twenty as discussed above in relation to FIG. 2:

$Y_{i,404}=0$ and $X_{i,404}=-10$;

$Y_{i,402}=20$ and $X_{i,402}=10$;

$Y_{i,414}=0$ and $X_{i,414}=-10$;

$Y_{i,412}=20$ and $X_{i,412}=10$;

$Y_{i,416}=-20$ and $X_{i,416}=-10$;

$Y_{i,418}=0$ and $X_{i,418}=10$;

$Y_{i,424}=0$ and $X_{i,424}=-10$;

$Y_{i,422}=20$ and $X_{i,422}=10$;

$Y_{i,426}=-20$ and $X_{i,426}=-10$; and $Y_{i,428}=0$ and $X_{i,428}=10$.

Using trellis diagram 400, operation of Viterbi decoder 300 is described for a conditional input saturation in accordance with that set forth in the preceding pseudo-code. This is discussed in relation to a transition between Step '1' and Step '2'. It should be noted that branch metrics corresponding to transitions between the other steps are similarly computed for each of the branches transitioning between other steps of trellis diagram 400. Where, for example, input 305 is a positive five (5), it is within the expected range and thus the branch metrics for each of the four branches is the Euclidean distance as follow:

$BM_{412}=(5-20)^2=225$;

$BM_{414}=(5-0)^2=25$;

$BM_{416}=(5-(-20))^2=625$;

$BM_{418}=(5-0)^2=25$.

In contrast, where, for example, input 305 is a positive twenty-five (25), it is outside of the expected range and it is conditionally saturated (i.e., input 305 is set to twenty (20)) for the purpose of calculating the branch metric for branch 412. The resulting branch metrics are as follow:

$BM_{412}=(20-20)^2=0$;

$BM_{414}=(25-0)^2=625$;

$BM_{416}=(25-(-20))^2=2025$;

$BM_{418}=(25-0)^2=625$.

Where, for example, input 305 is a negative twenty-five (−23), it is outside of the expected range and it is conditionally saturated (i.e., input 305 is set to negative twenty (−20)) for the purpose of calculating the branch metric for branch 416. The resulting branch metrics are as follow:

$BM_{412}=(-23-20)^2=1849$;

$BM_{414}=(-23-0)^2=529$;

$BM_{416}=(-20-(-20))^2=0$;

$BM_{418}=(-23-0)^2=529$.

The aforementioned branch metrics may be used in the calculation of path metrics as discussed above in relation to FIG. 2.

As can be seen using the preceding exemplary values, the most likely branch is favored in each of the calculations, and the process of saturating input 305 accentuates the favorability of the appropriate branch leading to an increased accuracy of the implemented algorithm when compared to a non-saturated implementation. It should be noted that the previously selected ranges and input values are merely exemplary and are provided for discussion purposes. Based on the disclosure provided herein, one of ordinary skill in the art will recognize a myriad of different ranges and input values that may be used in relation to one or more embodiments of the present invention.

Figure 5:
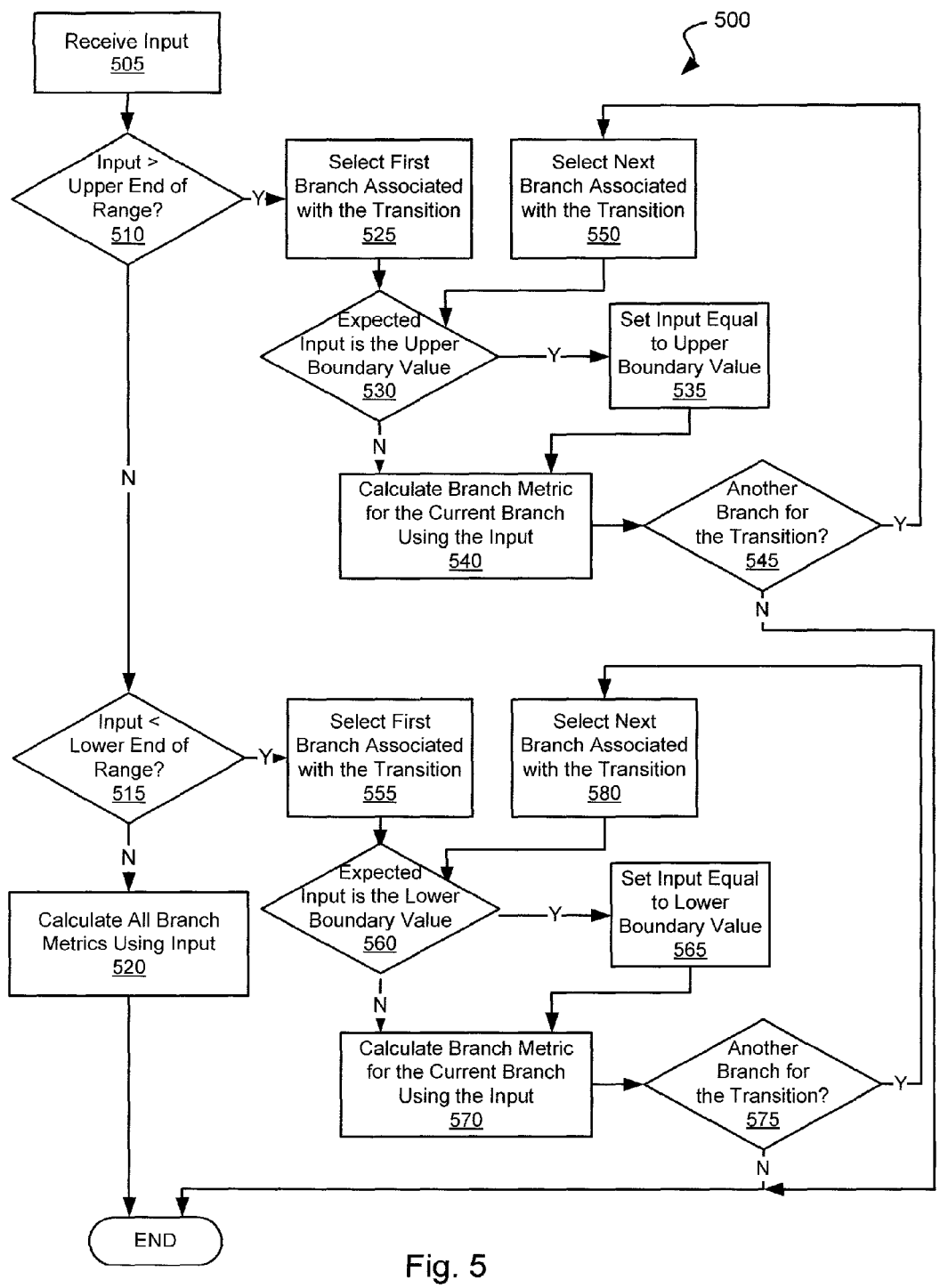
FIG. 5 is a flow diagram depicting a method in accordance with some embodiments of the present invention for calculating branch metrics based on conditionally saturated inputs.

Turning to FIG. 5, a flow diagram 500 depicts a method in accordance with some embodiments of the present invention for calculating branch metrics based on conditionally saturated inputs. In particular, flow diagram demonstrates the scenario where the input is saturated when it is: (1) outside of an expected range, and (2) the ideal edge of the trellis is the closest boundary condition. Following flow diagram 500, an input is received (block 505). As previously discussed, such an input may be a soft input that incorporates reliability information into a representation of a logic '1' or a logic '0'. The input may be received from some type of a channel such as, for example, a read channel associated with a storage device or a transmission channel associated with a transmission system. Based on the disclosure provided herein, one of ordinary skill in the art will recognize a variety of input sources that may be used in relation to one or more embodiments of the present invention.

It is determined whether the received input is within an expected input range. In particular, it is determined whether the received input is outside and greater than the expected input range (block 510). Where the received input is not greater than the expected input range (block 510), it is determined whether the received input is outside and less than the expected input range (block 515). Where it is determined that the received input is not less than the expected input range (block 515), branch metrics associated with a transition from one step to another step are calculated using the received input. In some cases, such branch metrics are calculated as the Euclidean distance between the received input and an ideal, expected input for the particular branch.

Alternatively, where it is determined that the received input is greater than the expected range (block 510), the first branch associated with the step transition is selected (block 525). It is determined if the expected input associated with the branch is equal to or approximately equal to the upper boundary of the expected range (block 530). Where the expected input is equal to or approximately equal to the upper boundary of the expected range (block 530), the received input is set equal to the upper boundary value (block 535), and the branch metric is calculated based on the modified or saturated input value (block 540). Alternatively, where it is determined that the expected input is not equal to or not approximately equal to the upper boundary of the expected range (block 530), the branch metric is calculated using the received input (i.e., the unsaturated input) (block 540). It is then determined whether other branches for the transition remain (block 545). Where one or more branches for the transition remain (block 545), the next branch associated with the transition is selected (block 550) and the preceding processes (block 530-block 540) are repeated for the selected branch. Alternatively, where no branches remain (block 545), the branch metrics calculations have been completed for the particular transition.

As yet another alternative, where it is determined that the received input is less than the expected range (block 515), the first branch associated with the step transition is selected (block 555). It is determined if the expected input associated with the branch is equal to or approximately equal to the lower boundary of the expected range (block 560). Where the expected input is equal to or approximately equal to the lower boundary of the expected range (block 560), the received input is set equal to the lower boundary value (block 565), and the branch metric is calculated based on the modified or saturated input value (block 570). Alternatively, where it is determined that the expected input is not equal to or not approximately equal to the upper boundary of the expected range (block 560), the branch metric is calculated using the received input (i.e., the unsaturated input) (block 570). It is then determined whether other branches for the transition remain (block 575). Where one or more branches for the transition remain (block 575), the next branch associated with the transition is selected (block 550) and the preceding processes (block 560-block 570) are repeated for the selected branch. Alternatively, where no branches remain (block 575), the branch metrics calculations have been completed for the particular transition.

As discussed above, particular embodiments of the present invention may be tailored for application to a Viterbi decoding process, however, it should be noted that the principle of conditionally saturating an input may be applied to various decoding and signal processing operations. Further, while the above described embodiments are described in relation to soft input Viterbi decoders, a similar approach for conditionally saturating an input may be applied to a hard input Viterbi decoder where the hard input occasionally extends beyond the boundaries of a discretely defined input set. As used herein, the phrase "hard input" implies an input stream including a number of absolute symbols. In such embodiments, the calculated distances may be Hamming distances as are known in the art. Also, as used herein, the phrase "soft input" implies an input stream including a number of symbols each associated with or incorporating reliability information. For such soft input Viterbi decoders, a squared Euclidean distance may be used as the calculated metric. Based on the disclosure provided herein, one of ordinary skill in the art will recognize appropriate uses for both soft input and hard input Viterbi decoders, and appropriate distance calculations to be used in relation to the particular implementation.

In conclusion, the invention provides novel systems, devices, methods and arrangements for decoding encoded information. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A detector, wherein the detector comprises:
   a branch metric calculator, wherein the branch metric calculator is operable to:
   receive an actual input,
   compare the actual input with an expected range, wherein a comparison result is created indicating that the actual input is outside of the expected range;
   create a saturated input;
   calculate a first branch metric associated with a first branch, wherein the first branch has an expected value representing a boundary of the expected range, and wherein calculating the first branch metric is done using the saturated input; and
   calculate a second branch metric associated with a second branch, wherein the second branch has an expected value representing something other than a boundary of the expected range, and wherein calculating the second branch metric is done using the actual input.

2. The detector of claim 1, wherein the detector further comprises:
   a path metric calculator, wherein the path metric calculator is operable to:
   calculate a first path metric, wherein the first path metric uses the first branch metric;
   calculate a second path metric, wherein the second path metric uses the second branch metric; and
   determine which of the first path metric and the second path metric is associated with a most likely codeword.

3. The detector of claim 1, wherein the comparison result indicates that the actual input is greater than the expected range, wherein the first branch has an expected value representing an upper boundary of the expected range, and wherein the saturated input has a value representing the upper boundary of the expected range.

4. The detector of claim 3, wherein the value representing the upper value of the expected range is equal to the upper value of the expected range.

5. The detector of claim 1, wherein the comparison result indicates that the actual input is less than the expected range, wherein the first branch has an expected value representing the lower boundary of the expected range, and wherein the saturated input has a value representing the lower boundary of the expected range.

6. The detector of claim 5, wherein the value representing the lower value of the expected range is equal to the lower value of the expected range.

7. The detector of claim 1, wherein the value of the second branch metric is greater than the value of the first branch metric.

8. A method for data decoding using conditional input saturation, the method comprising:
   providing a branch metric calculator, wherein the branch metric calculator is operable to calculate a branch metric associated with a branch with an expected branch input;
   receiving an actual input at the branch metric calculator;
   comparing the actual input with an expected range, wherein a comparison result is created;
   creating a saturated input; and
   calculating the branch metric, wherein depending upon a combination of the expected branch input and the comparison result, one of the actual input and the saturated input is used to calculate the branch metric.

9. The method of claim 8, wherein the comparison result indicates that the actual input is greater than the expected range, wherein the branch has an expected value representing the upper boundary of the expected range, and wherein the value of the saturated input represents the upper boundary of the expected range.

10. The method of claim 9, wherein the value representing the upper value of the expected range is equal to the upper value of the expected range.

11. The method of claim 10, wherein calculating the branch metric includes calculating a Euclidean distance between the saturated input value and the expected value.

12. The method of claim 11, wherein the branch metric is approximately equal to zero.

13. The method of claim 8, wherein the branch metric is a first branch metric, wherein the branch is a first branch, wherein the expected branch input is a first expected branch input, wherein the branch metric calculator is operable to calculate a second branch metric associated with a second branch with a second expected branch input, and wherein the method further comprises:
calculating the second branch metric, wherein the second branch metric is calculated using the actual input.

14. The method of claim 13, wherein the second expected branch input has a value different from a value of the boundary of the expected range.

15. The method of claim 14, wherein calculating the second branch metric includes calculating a Euclidean distance between the actual value of the input and the second expected branch input.

16. The method of claim 15, wherein the second branch metric is greater than the first branch metric.

17. The method of claim 13, wherein the method further comprises:
calculating a first path metric, wherein the first path metric uses the first branch metric; and
calculating a second path metric, wherein the second path metric uses the second branch metric.

18. The method of claim 17, wherein the method further comprises:
determining which of the first path metric and the second path metric is associated with a most likely codeword.

19. A Viterbi detector, wherein the Viterbi detector comprises:
a branch metric calculator, wherein the branch metric calculator is operable to:
receive an actual input,
compare the actual input with an expected range, wherein a comparison result is created indicating that the actual input is greater than the expected range;
create a saturated input, wherein the saturated input is equal to the upper boundary of the expected range;
calculate a first branch metric associated with a first branch, wherein the first branch has an expected value equal to an upper boundary of the expected range, and wherein calculating the first branch metric is done using the saturated input; and
calculate a second branch metric associated with a second branch, wherein the second branch has an expected value different from the upper boundary of the expected range, and wherein calculating the second branch metric is done using the actual input; and
a path metric calculator, wherein the path metric calculator is operable to:
calculate a first path metric, wherein the first path metric uses the first branch metric;
calculate a second path metric, wherein the second path metric uses the second branch metric; and
determine which of the first path metric and the second path metric is associated with a most likely codeword.

20. The Viterbi detector of claim 19, wherein calculating the first branch metric includes calculating a Euclidean distance between the saturated input and the upper boundary of the expected range, and wherein calculating the second branch metric includes calculating a Euclidean distance between the actual input and the expected input associated with the second branch.

* * * * *